United States Patent
Jose et al.

(10) Patent No.: US 10,476,707 B2
(45) Date of Patent: Nov. 12, 2019

(54) HYBRID HALF/QUARTER-RATE DFE

(71) Applicant: Samsung Display Co., Ltd., Yongin-si, Gyeonggi-do (KR)

(72) Inventors: Anup P. Jose, San Jose, CA (US); Amir Amirkhany, Sunnyvale, CA (US); Mohammad Hekmat, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/058,896

(22) Filed: Aug. 8, 2018

(65) Prior Publication Data

US 2019/0273639 A1 Sep. 5, 2019

Related U.S. Application Data

(60) Provisional application No. 62/638,739, filed on Mar. 5, 2018.

(51) Int. Cl.
| | |
|---|---|
| *H03H 7/30* | (2006.01) |
| *H04L 25/03* | (2006.01) |
| *H03K 3/356* | (2006.01) |

(52) U.S. Cl.
CPC ... *H04L 25/03267* (2013.01); *H03K 3/35613* (2013.01); *H04L 25/03057* (2013.01); *H04L 2025/03503* (2013.01)

(58) Field of Classification Search
CPC ......... H04L 25/03267; H04L 25/03057; H04L 2025/03503; H03K 3/35613
USPC ....................................................... 375/233
See application file for complete search history.

(56) References Cited

U.S. PATENT DOCUMENTS

| | | | |
|---|---|---|---|
| 7,697,603 B1 | 4/2010 | Wang et al. | |
| 7,715,474 B2 | 5/2010 | Park et al. | |
| 8,102,906 B2 | 1/2012 | Hollis | |
| 8,401,065 B2 | 3/2013 | Hidaka | |
| 9,106,461 B2 | 8/2015 | Parikh | |
| 9,444,437 B2 | 9/2016 | Bulzacchelli et al. | |
| 9,531,570 B2 | 12/2016 | Hekmat et al. | |
| 9,680,436 B1* | 6/2017 | Malhotra | ................ H04B 1/16 |
| 2010/0054324 A1* | 3/2010 | Bulzacchelli | ..... H04L 25/03057 375/233 |

(Continued)

FOREIGN PATENT DOCUMENTS

JP 6142706 B2 6/2017

OTHER PUBLICATIONS

Partial European Search Report for corresponding European Patent Application No. 19160874.4, dated Jul. 30, 2019, 20 pages.

(Continued)

*Primary Examiner* — Helene E Tayong
(74) *Attorney, Agent, or Firm* — Lewis Roca Rothgerber Christie LLP

(57) ABSTRACT

A two-stage decision feedback equalizer. The decision feedback equalizer is configured to receive serial data, at an analog input, at a first data rate. The two-stage decision feedback equalizer has an analog input and four digital outputs, and includes a first stage and a second stage. The first stage is connected to the analog input, and includes a half-rate predictive decision feedback equalizer consisting of current mode logic circuits. The second stage is connected to the first stage, and consists of complementary metal oxide semiconductor circuits.

20 Claims, 4 Drawing Sheets

(56) References Cited

U.S. PATENT DOCUMENTS

2013/0287311 A1* 10/2013 Furihata .................... G06T 9/00
                                                                        382/233
2018/0183422 A1* 6/2018 Yasotharan ............ H03K 5/249

OTHER PUBLICATIONS

Yuan, Shuai, et al.; A 10Gb/s Speculative Decision Feedback Equalizer with a Novel Implementation of Adaption in 65nm CMOS Technology, 2015 IEEE International Conference on Electron Devices and State Circuits, Jun. 18, 2014, XP032747316, 2 pages.

* cited by examiner

# HYBRID HALF/QUARTER-RATE DFE

CROSS-REFERENCE TO RELATED APPLICATION(S)

The present application claims priority to and the benefit of U.S. Provisional Application No. 62/638,739, filed Mar. 5, 2018, entitled "HYBRID HALF/QUARTER-RATE DFE ARCHITECTURE", the entire content of which is incorporated herein by reference.

FIELD

One or more aspects of embodiments according to the present invention relate to serial data receivers, and more particularly to a decision feedback equalizer for a serial data receiver.

BACKGROUND

In an integrated circuit, a serial data receiver may be configured to operate at high speed, to achieve high data rate data transfers with other integrated circuits. In some embodiments the data rate and the corresponding clock rate may be sufficiently high that complementary metal oxide semiconductor (CMOS) circuits also within the integrated circuit may be incapable of operating at the same clock rate, or would exhibit unacceptably high power consumption were they operating at such a clock rate.

In such cases, a half-rate or quarter-rate decision feedback equalizer may be employed to convert the received serial data stream into two or four parallel data streams each at one half or one quarter, respectively, of the received data. Such a half-rate or quarter-rate decision feedback equalizer may be implemented in current mode logic, which, however, may exhibit relatively high power consumption.

Thus, there is a need for a low-power circuit for reducing the data rate of serial data.

SUMMARY

According to an embodiment of the present disclosure, there is provided a two-stage decision feedback equalizer for receiving serial data, at an analog input, at a first data rate, the two-stage decision feedback equalizer comprising: a first stage, comprising a half-rate predictive decision feedback equalizer having: an analog input connected to the analog input of the two-stage decision feedback equalizer, a first digital output, and a second digital output; and a second stage, comprising: a first flip flop having a data input connected to the first digital output, a second flip flop having a data input connected to the first digital output, a third flip flop having a data input connected to the second digital output, and a fourth flip flop having a data input connected to the second digital output, the first stage being in a first clock domain configured to operate with a first clock at a frequency equal to one half of the first data rate, and the second stage being in a second clock domain configured to operate with a second clock at a frequency equal to one quarter of the first data rate.

In some embodiments, the first stage consists of current mode logic circuits.

In some embodiments, the second stage consists of complementary metal oxide semiconductor circuits.

In some embodiments, the first stage comprises: a first path having an input connected to the analog input, and a second path having an input connected to the analog input, the first path being configured to generate, at the first digital output, a digital data value with every cycle of the first clock, during a portion of a time interval when the first clock is low; and the second path being configured to generate, at the second digital output, a digital data value with every cycle of the first clock, during a portion of a time interval when the first clock is high.

In some embodiments, the two-stage decision feedback equalizer further includes a phase control circuit configured to align transitions of a first phase of the second clock with transitions of a first phase of the first clock.

In some embodiments, the phase control circuit comprises a fifth flip flop having: a data input connected to the first phase of the first clock, a clock input connected to the first phase of the second clock, and an output.

In some embodiments, the phase control circuit further comprises: a phase interpolator, configured: to receive: two phases of the second clock, the two phases differing by more than 0 degrees and less than 180 degrees, and a control signal; and to form, as output, a signal having a phase corresponding to the control signal.

In some embodiments, the two-stage decision feedback equalizer further includes a logic circuit having: an input connected to the output of the fifth flip flop, and an output connected to the phase interpolator, the logic circuit being configured to generate the control signal for the phase interpolator.

In some embodiments, the logic circuit comprises an up-down counter, configured: to increment a count value when the output of the fifth flip flop is high and to decrement the count value when the output of the fifth flip flop is low.

In some embodiments, the first flip flop has a clock input configured to receive a first phase of the second clock, the first phase of the second clock having a rising edge aligned with every other falling edge of the first clock.

In some embodiments, the second flip flop has a clock input configured to receive a second phase of the second clock, the second phase of the second clock having a rising edge aligned with every falling edge of the first phase of the second clock.

In some embodiments, the third flip flop has a clock input configured to receive a third phase of the second clock, the third phase of the second clock having a rising edge following each rising edge of the first phase of the second clock by one quarter cycle of the second clock.

In some embodiments, the fourth flip flop has a clock input configured to receive a fourth phase of the second clock, the fourth phase of the second clock having a rising edge aligned with every falling edge of the third phase of the second clock. According to an embodiment of the present disclosure, there is provided a two-stage decision feedback equalizer for receiving serial data, at an analog input, at a first data rate, the two-stage decision feedback equalizer comprising: a first stage, connected to the analog input, the first stage comprising a half-rate predictive decision feedback equalizer consisting of current mode logic circuits; and a second stage, connected to the first stage, the second stage consisting of complementary metal oxide semiconductor circuits.

In some embodiments: the half-rate predictive decision feedback equalizer of the first stage has: an analog input connected to the analog input of the two-stage decision feedback equalizer, a first digital output, and a second digital output; and the second stage comprises: a first flip flop having a data input connected to the first digital output, a second flip flop having a data input connected to the first digital output, a third flip flop having a data input connected to the second digital output, and a fourth flip flop having a data input connected to the second digital output, the first stage being in a first clock domain configured to operate with a first clock at a frequency equal to one half of the first data rate, and the second stage being in a second clock domain configured to operate with a second clock at a frequency equal to one quarter of the first data rate.

In some embodiments, the first stage comprises: a first path having an input connected to the analog input, and a second path having an input connected to the analog input, the first path being configured to generate, at the first digital output, a digital data value with every cycle of the first clock, during a portion of a time interval when the first clock is low; and the second path being configured to generate, at the second digital output, a digital data value with every cycle of the first clock, during a portion of a time interval when the first clock is high.

In some embodiments, the two-stage decision feedback equalizer further includes a phase control circuit configured to align transitions of a first phase of the second clock with transitions of a first phase of the first clock.

In some embodiments, the phase control circuit comprises a fifth flip flop having: a data input connected to the first phase of the first clock, a clock input connected to the first phase of the second clock, and an output.

In some embodiments, the phase control circuit further comprises: a phase interpolator, configured: to receive: two phases of the second clock, the two phases differing by more than 0 degrees and less than 180 degrees, and a control signal; and to form, as output, a signal having a phase corresponding to the control signal. According to an embodiment of the present disclosure, there is provided a display, comprising: a timing controller having a serial data output; and a driver integrated circuit having an analog input for receiving serial data, at a first data rate, the driver integrated circuit comprising a two-stage decision feedback equalizer for receiving the serial data, the two-stage decision feedback equalizer having an analog input connected to the analog input of the driver integrated circuit, the two-stage decision feedback equalizer comprising: a first stage, connected to the analog input, the first stage comprising a half-rate predictive decision feedback equalizer consisting of current mode logic circuits; and a second stage, connected to the first stage, the second stage consisting of complementary metal oxide semiconductor circuits.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a hybrid half/quarter-rate DFE provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1:
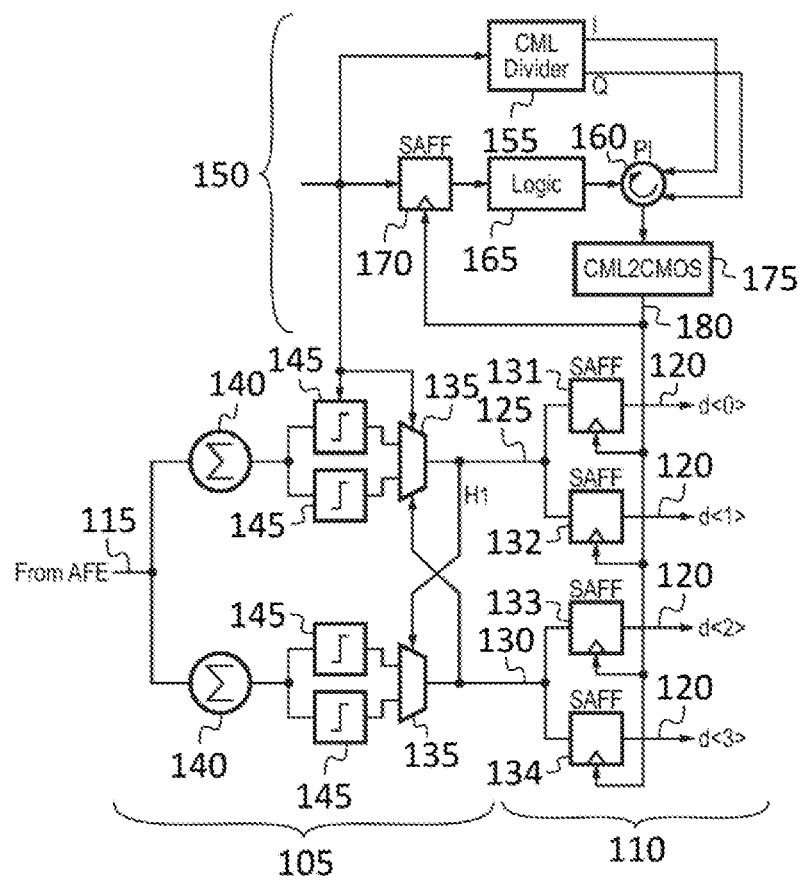
FIG. 1 is a schematic diagram of a two-stage decision feedback equalizer, according to an embodiment of the present invention.

Referring to FIG. 1, in some embodiments a hybrid half/quarter-rate decision feedback equalizer (DFE) includes a first stage 105, consisting of current mode logic (CML) circuits, and a second stage 110, consisting of complementary metal oxide semiconductor (CMOS) circuits. The hybrid half/quarter-rate DFE has an analog input 115 for receiving a high-speed serial data signal, and four digital outputs 120, at which the serial data are produced, parallelized by a factor of 4 (and transmitted, at each of the four digital outputs 120. at one quarter the rate of the received serial data). The CML circuits may operate in a first clock domain, having a first, half-rate, clock (i.e., a clock that has one period for every two bits of the received serial data signal) and the CMOS circuits may operate in a second clock domain, having a second, quarter-rate, clock, i.e., a clock with a frequency that is one half of the frequency of the first clock. The first clock may be generated from the received serial data signal by a clock recovery circuit. Each CML circuit may operate with differential digital signals assuming, at any time, one of two discrete differential voltage values. Each of the conductors carrying a differential CML signal may have a voltage swing (in changing between the two states) of, for example, 0.4 V (which may be significantly less than the difference between Vdd and ground); accordingly, the differential swing may be 0.8 V. Each CMOS circuit may similarly operate with digital signals assuming, at any time, one of two discrete voltage values, the two values being near ground and near Vdd, respectively.

The first stage includes an analog input that is (e.g., that is connected to) the analog input 115 of the two-stage quarter-rate decision feedback equalizer, a first digital output 125, and a second digital output 130. The first stage includes (i) a first path including a first adder 140, a first pair of clocked comparators (or "samplers" or "slicers") 145, and a first multiplexer 135 feeding the first digital output 125 of the first stage, and (ii) a second path including a second adder 140, a second pair of clocked comparators 145, and a second multiplexer 135 feeding the second digital output 130 of the first stage. Each of the multiplexers may be a latching multiplexer (or "MUX-latch").

Serial data bits from the received serial data stream are produced alternately at the first digital output 125, and at the second digital output 130; each output is used by a multiplexer in the circuit feeding the other output to select between two predictively corrected data values, each corrected based on a respective one of the two possible values of the data bit received immediately previously.

The second stage includes four flip flops (e.g., strong arm flip flops, "SAFF") 131, 132, 133, 134, each having an output that is (e.g., that is connected to) a respective one of the four digital outputs 120, a data input, and a clock input. The data inputs of the first two flip flops are both connected to the first digital output 125, and the data inputs of third and fourth flip flops are both connected to the second digital output 130. The clock signals fed to the clock inputs of the first two flip flops have triggering edges (e.g., rising edges)

timed so that the flip flops capture alternating bits from the first digital output 125, as discussed in further detail below, and the clock signals fed to the clock inputs of the third and fourth flip flops have triggering edges timed so that the flip flops capture alternating bits from the second digital output 130. Each SAFF may also serve as a CML-to-CMOS converter for data.

In some embodiments a clock synchronization circuit 150 may be employed to synchronize the second clock (the quarter-rate clock) to the first clock (the half-rate clock). The clock synchronization circuit 150 includes a CML divider 155, a phase interpolator 160, a control logic circuit 165, a replica flip flop 170 (which may be a copy of the strong arm flip flops 131, 132, 133, 134, all of which may be nominally identical), and a CML to CMOS conversion circuit 175. The output 180 of the CML to CMOS conversion circuit 175 includes four phases of the second clock, which may, for example be transmitted on two pairs of conductors (i.e., four conductors), each of which may carry a differential signal (i.e., a signal and its complement). Of these four conductors a first pair of conductors may carry a first phase of the second clock and its complement, and the second pair of conductors may carry a third phase of the second clock and its complement. A second phase of the second clock may be formed by inverting the first phase (i.e., by interchanging the conductors) and a fourth phase of the second clock may be formed by inverting the third phase (i.e., by interchanging the conductors). The first, second, third and fourth phases may be fed to the clock inputs of the first flip flop 131, the second flip flop 132, the third flip flop 133, and the fourth flip flop 134, respectively.

The CML divider 155 generates two signals, an in-phase signal 160 and a quadrature phase signal 165, each at one half of the frequency of the first clock. The replica flip flop 170 receives at its data input the first clock, and at its clock input the first phase of the second clock. The control logic circuit 165 adjusts the phase of the phase interpolator 160 based on whether the output of the replica flip flop 170 consists primarily of zeros or ones, so that edges of the first clock are aligned with rising edges of the second clock (e.g., so that falling edges of the first clock are aligned with rising edges of the first phase of the second clock (see FIG. 3)). The control logic circuit 165 may for example include a counter that counts up when a one is received and that counts down when a zero is received, and the value of the count may periodically be send to the phase interpolator 160 as a phase command.

Figure 2:
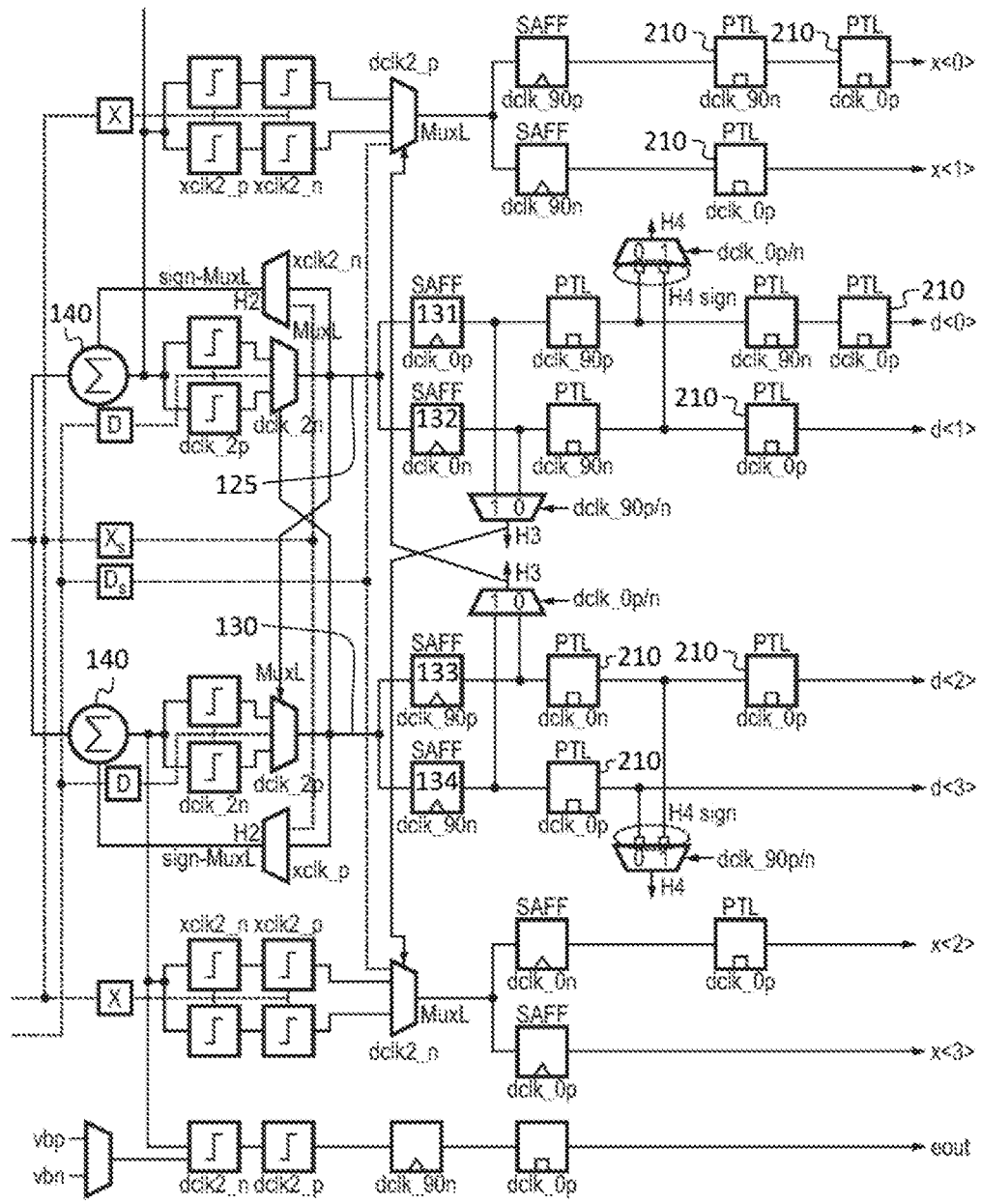
FIG. 2 is a schematic diagram of a two-stage decision feedback equalizer, according to an embodiment of the present invention.

FIG. 2 shows the first stage and the second stage of the hybrid half/quarter-rate DFE, as well as additional circuits used to generate crossing clocks and crossing data (x<0>, x<1>, x<2>, x<3>) which may be used by the clock recovery circuit, and to control the phase of the first clock at the data slicers and crossing slicers of the first stage. Each of the circuits for producing the crossing data may include a portion within the first stage, e.g., up to and including the multiplexers (labeled "MuxL") (and these portions may be constructed of CML circuits), and a portion within the second stage (beginning with the strong arm flip flops receiving the signals from the multiplexers) (and these portions may be constructed of CMOS circuits).

Figure 3:
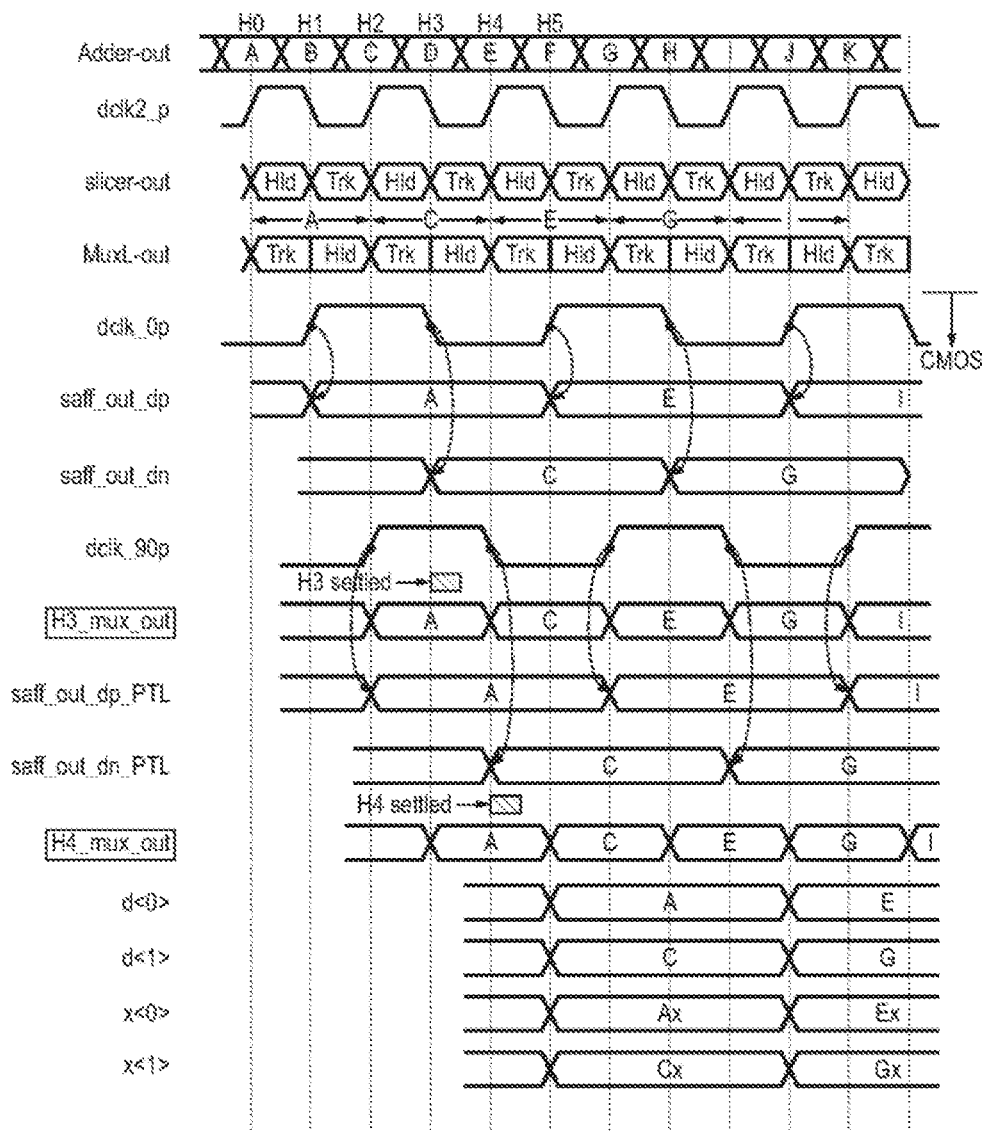
FIG. 3 is a timing diagram of a two-stage decision feedback equalizer, according to an embodiment of the present invention.

Also shown in FIG. 2 are pass transistor logic (PTL) latches 210 that are used to align the phases of the four digital outputs (d<0>, d<1>, d<2>, d<3>). FIG. 3 shows a partial timing diagram for the circuit of FIGS. 1 and 2. The timing waveform for the first digital output 125 is shown as the fourth waveform of FIG. 3, labelled "MuxL-out". The input data stream containing data bits "A", "B", "C", etc., is the first waveform shown; the sixth and seventh waveforms show the first and fifth bits ("A" and "E") being transmitted at the output of the first flip flop 131, and the third and seventh bits ("C" and "G") being transmitted at the output of the second flip flop 132. The first phase of the second clock (the quarter-rate clock) is the fifth waveform ("dclk_0p") (and the second phase is its complement).

Figure 4:
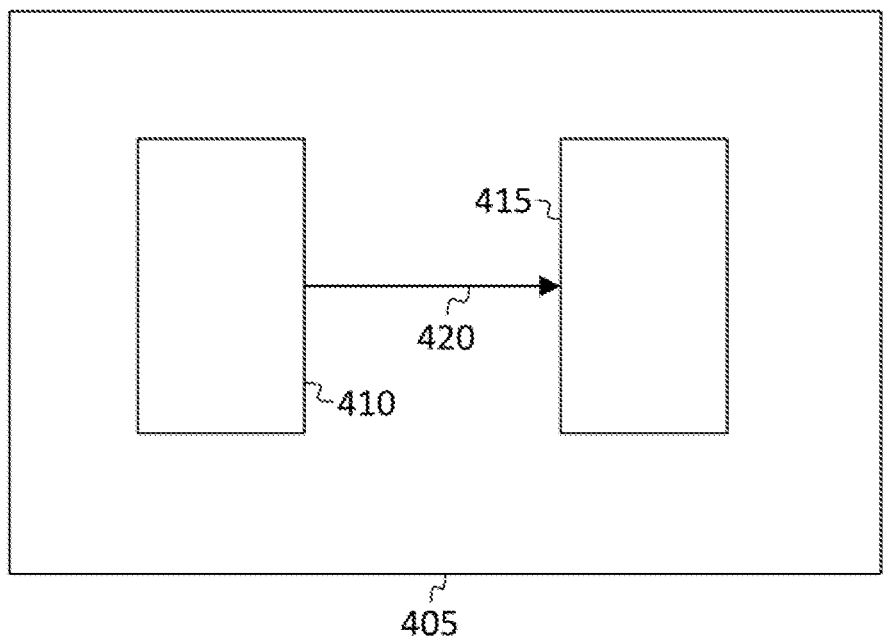
FIG. 4 is a block diagram of a display, according to an embodiment of the present invention.

Referring to FIG. 4, in one embodiment a display 405 contains a timing controller 410 configured to send high-speed digital data to a driver integrated circuit (driver IC) 415, over a serial data link 420. The driver integrated circuit 415 includes a serial data receiver, at the receiving end of the serial data link 420, constructed according to an embodiment of the present invention.

As used herein, a "phase" of a clock signal is a version of the clock signal having some phase offset with respect to a first phase of the clock signal. As such, a differential clock signal is referred to herein as a two-phase clock, if in some circuits the clock is connected to have an effect on a first edge (e.g., a rising edge of the clock signal) and in some circuits the clock is connected to have an effect on a second edge (e.g., a rising edge of the complementary clock signal).

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a hybrid half/quarter-rate DFE have been specifically described and illustrated herein, many modifications and variations will be apparent to those skilled in the art. Accordingly, it is to be understood that a hybrid half/quarter-rate DFE constructed according to principles of this invention may be embodied other than as specifically described herein. The invention is also defined in the following claims, and equivalents thereof.

What is claimed is:

1. A two-stage decision feedback equalizer for receiving serial data, at an analog input, at a first data rate,
the two-stage decision feedback equalizer comprising:
a first stage, comprising a half-rate predictive decision feedback equalizer having:
an analog input connected to the analog input of the two-stage decision feedback equalizer,
a first digital output, and
a second digital output; and
a second stage, comprising:
a first flip flop having a data input connected to the first digital output,
a second flip flop having a data input connected to the first digital output,
a third flip flop having a data input connected to the second digital output, and
a fourth flip flop having a data input connected to the second digital output,
the first stage being in a first clock domain configured to operate with a first clock at a frequency equal to one half of the first data rate, and
the second stage being in a second clock domain configured to operate with a second clock at a frequency equal to one quarter of the first data rate.

2. The two-stage decision feedback equalizer of claim 1, wherein the first stage comprises current mode logic circuits.

3. The two-stage decision feedback equalizer of claim 1, wherein the second stage comprises complementary metal oxide semiconductor circuits.

4. The two-stage decision feedback equalizer of claim 1, wherein the first stage comprises:
a first path having an input connected to the analog input, and
a second path having an input connected to the analog input,
the first path being configured to generate, at the first digital output, a digital data value with every cycle of the first clock, during a portion of a time interval when the first clock is low; and
the second path being configured to generate, at the second digital output, a digital data value with every cycle of the first clock, during a portion of a time interval when the first clock is high.

5. The two-stage decision feedback equalizer of claim 1, further comprising a phase control circuit configured to align transitions of a first phase of the second clock with transitions of a first phase of the first clock.

6. The two-stage decision feedback equalizer of claim 5, wherein the phase control circuit comprises a fifth flip flop having:
a data input connected to the first phase of the first clock,
a clock input connected to the first phase of the second clock, and
an output.

7. The two-stage decision feedback equalizer of claim 6, wherein the phase control circuit further comprises:
a phase interpolator, configured:
to receive:
two phases of the second clock, the two phases differing by more than 0 degrees and less than 180 degrees, and
a control signal; and
to form, as output, a signal having a phase corresponding to the control signal.

8. The two-stage decision feedback equalizer of claim 7, further comprising a logic circuit having:
an input connected to the output of the fifth flip flop, and
an output connected to the phase interpolator, the logic circuit being configured to generate the control signal for the phase interpolator.

9. The two-stage decision feedback equalizer of claim 8, wherein the logic circuit comprises an up-down counter, configured:
to increment a count value when the output of the fifth flip flop is high and
to decrement the count value when the output of the fifth flip flop is low.

10. The two-stage decision feedback equalizer of claim 1, wherein the first flip flop has a clock input configured to receive a first phase of the second clock, the first phase of the second clock having a rising edge aligned with every other falling edge of the first clock.

11. The two-stage decision feedback equalizer of claim 10, wherein the second flip flop has a clock input configured to receive a second phase of the second clock, the second phase of the second clock having a rising edge aligned with every falling edge of the first phase of the second clock.

12. The two-stage decision feedback equalizer of claim 11, wherein the third flip flop has a clock input configured to receive a third phase of the second clock, the third phase of the second clock having a rising edge following each rising edge of the first phase of the second clock by one quarter cycle of the second clock.

13. The two-stage decision feedback equalizer of claim 12, wherein the fourth flip flop has a clock input configured to receive a fourth phase of the second clock, the fourth phase of the second clock having a rising edge aligned with every falling edge of the third phase of the second clock.

14. A two-stage decision feedback equalizer for receiving serial data, at an analog input, at a first data rate,
the two-stage decision feedback equalizer comprising:
a first stage, connected to the analog input, the first stage comprising a half-rate predictive decision feedback equalizer comprising current mode logic circuits; and
a second stage, connected to the first stage, the second stage comprising complementary metal oxide semiconductor circuits,
the first stage being in a first clock domain configured to operate with a first clock at a frequency equal to one half of the first data rate, and
the second stage being in a second clock domain configured to operate with a second clock at a frequency equal to one quarter of the first data rate.

15. The two-stage decision feedback equalizer of claim 14, wherein:
the half-rate predictive decision feedback equalizer of the first stage has:
an analog input connected to the analog input of the two-stage decision feedback equalizer,
a first digital output, and
a second digital output; and
the second stage comprises:
a first flip flop having a data input connected to the first digital output, and
a second flip flop having a data input connected to the first digital output.

16. The two-stage decision feedback equalizer of claim 15, wherein the first stage comprises:
a first path having an input connected to the analog input, and
a second path having an input connected to the analog input,
the first path being configured to generate, at the first digital output, a digital data value with every cycle of the first clock, during a portion of a time interval when the first clock is low; and
the second path being configured to generate, at the second digital output, a digital data value with every cycle of the first clock, during a portion of a time interval when the first clock is high.

17. The two-stage decision feedback equalizer of claim 15, further comprising a phase control circuit configured to align transitions of a first phase of the second clock with transitions of a first phase of the first clock.

18. The two-stage decision feedback equalizer of claim 17, wherein the phase control circuit comprises a third flip flop having:
a data input connected to the first phase of the first clock,
a clock input connected to the first phase of the second clock, and
an output.

19. The two-stage decision feedback equalizer of claim 18, wherein the phase control circuit further comprises:
a phase interpolator, configured:
to receive:
two phases of the second clock, the two phases differing by more than 0 degrees and less than 180 degrees, and
a control signal; and
to form, as output, a signal having a phase corresponding to the control signal.

20. A display, comprising:
a timing controller having a serial data output; and
a driver integrated circuit having an analog input for receiving serial data, at a first data rate,
the driver integrated circuit comprising a two-stage decision feedback equalizer for receiving the serial data, the two-stage decision feedback equalizer having an analog input connected to the analog input of the driver integrated circuit,
the two-stage decision feedback equalizer comprising:
a first stage, connected to the analog input, the first stage comprising a half-rate predictive decision feedback equalizer comprising of current mode logic circuits; and
a second stage, connected to the first stage, the second stage comprising complementary metal oxide semiconductor circuits,
the first stage being in a first clock domain configured to operate with a first clock at a frequency equal to one half of the first data rate, and
the second stage being in a second clock domain configured to operate with a second clock at a frequency equal to one quarter of the first data rate.

* * * * *